United States Patent
Harris et al.

(10) Patent No.: US 11,196,395 B2
(45) Date of Patent: Dec. 7, 2021

(54) OPTICAL DIFFERENTIAL LOW-NOISE RECEIVERS AND RELATED METHODS

(71) Applicant: Lightmatter, Inc., Boston, MA (US)

(72) Inventors: Nicholas C. Harris, Jamaica Plain, MA (US); Michael Gould, Boston, MA (US); Omer Ozgur Yildirim, Wellesley, MA (US)

(73) Assignee: Lightmatter, Inc., Boston, MA (US)

( * ) Notice: Subject to any disclaimer, the term of this patent is extended or adjusted under 35 U.S.C. 154(b) by 106 days.

(21) Appl. No.: 16/411,391

(22) Filed: May 14, 2019

(65) Prior Publication Data

US 2020/0228077 A1    Jul. 16, 2020

Related U.S. Application Data

(60) Provisional application No. 62/793,327, filed on Jan. 16, 2019.

(51) Int. Cl.
*H03F 3/45*   (2006.01)
*H03F 1/26*   (2006.01)
*H03F 3/10*   (2006.01)

(52) U.S. Cl.
CPC ........... *H03F 3/45071* (2013.01); *H03F 1/26* (2013.01); *H03F 3/10* (2013.01); *H03F 3/45085* (2013.01)

(58) Field of Classification Search
CPC .......... H03F 3/45071; H03F 1/26; H03F 3/10
USPC ................. 330/59, 308; 250/214 A, 214 AG
See application file for complete search history.

(56) References Cited

U.S. PATENT DOCUMENTS

| | | | |
|---|---|---|---|
| 4,567,569 A | 1/1986 | Caulfield et al. |
| 4,633,428 A | 12/1986 | Byron |
| 4,868,803 A | 9/1989 | Sunagawa et al. |
| 5,004,309 A | 4/1991 | Caulfield et al. |
| 5,077,619 A | 12/1991 | Toms |

(Continued)

FOREIGN PATENT DOCUMENTS

| | | |
|---|---|---|
| CN | 101630178 A | 1/2010 |
| EP | 0251062 A2 | 7/1988 |

(Continued)

OTHER PUBLICATIONS

PCT/US2015/034500, Mar. 15, 2016, International Search Report and Written Opinion.

(Continued)

*Primary Examiner* — Khanh V Nguyen
(74) *Attorney, Agent, or Firm* — Wolf, Greenfield & Sacks, P.C.

(57) ABSTRACT

Low-noise optical differential receivers are described. Such differential receivers may include a differential amplifier having first and second inputs and first and second outputs, and four photodetectors. A first and a second of such photodetectors are coupled to the first input of the differential amplifier, and a third and a fourth of such photodetectors are coupled to the second input of the differential amplifier. The anode of the first photodetector and the cathode of the second photodetector are coupled to the first input of the differential amplifier. The cathode of the third photodetector and the anode of the fourth photodetector are coupled to the second input of the differential amplifier. The optical receiver may involve two stages of signal subtraction, which may significantly increase noise immunity.

13 Claims, 7 Drawing Sheets

(56) References Cited

U.S. PATENT DOCUMENTS

| | | | |
|---|---|---|---|
| 5,095,459 A | | 3/1992 | Ohta et al. |
| 5,117,099 A | * | 5/1992 | Schmidt .............. H04N 9/28 |
| | | | 250/208.2 |
| 5,254,957 A | * | 10/1993 | Lauffenburger .......... H03F 3/08 |
| | | | 330/252 |
| 5,410,145 A | * | 4/1995 | Coroy ..................... G01J 1/44 |
| | | | 250/214 C |
| 5,428,711 A | | 6/1995 | Akiyama et al. |
| 5,621,227 A | * | 4/1997 | Joshi ................. H01L 27/1446 |
| | | | 257/184 |
| 5,699,449 A | | 12/1997 | Javidi |
| 6,005,998 A | | 12/1999 | Lee |
| 6,525,858 B1 | * | 2/2003 | Nagahori ............. H04B 10/697 |
| | | | 250/214 A |
| 6,590,197 B2 | * | 7/2003 | Wadsworth ....... H01L 27/14634 |
| | | | 250/208.1 |
| 7,050,116 B2 | * | 5/2006 | Van Zanten ............ H04N 5/18 |
| | | | 348/572 |
| 7,173,272 B2 | | 2/2007 | Ralph |
| 7,230,227 B2 | | 6/2007 | Wilcken et al. |
| 7,660,533 B1 | | 2/2010 | Meyers et al. |
| 7,876,248 B2 | | 1/2011 | Berkley et al. |
| 7,985,965 B2 | | 7/2011 | Barker et al. |
| 8,018,244 B2 | | 9/2011 | Berkley |
| 8,023,828 B2 | | 9/2011 | Beausoleil et al. |
| 8,035,540 B2 | | 10/2011 | Berkley et al. |
| 8,190,553 B2 | | 5/2012 | Routt |
| 8,223,414 B2 | | 7/2012 | Goto |
| 8,247,780 B2 | | 8/2012 | Zhang et al. |
| 8,324,670 B2 | | 12/2012 | Bui et al. |
| 8,386,899 B2 | | 2/2013 | Goto et al. |
| 8,478,138 B2 | * | 7/2013 | Sugawara ............ H04B 10/677 |
| | | | 398/210 |
| 8,560,282 B2 | | 10/2013 | Macready et al. |
| 8,576,677 B2 | | 11/2013 | Kurokawa et al. |
| 8,604,944 B2 | | 12/2013 | Berkley et al. |
| 8,620,855 B2 | | 12/2013 | Bonderson |
| 8,837,544 B2 | | 9/2014 | Santori |
| 9,250,391 B2 | | 2/2016 | McLaughlin et al. |
| 9,354,039 B2 | | 5/2016 | Mower et al. |
| 9,791,258 B2 | | 10/2017 | Mower |
| 10,359,272 B2 | | 7/2019 | Mower et al. |
| 10,461,967 B1 | * | 10/2019 | Ahmed ................. H04B 10/61 |
| 10,483,922 B2 | * | 11/2019 | Shibata .............. H03F 3/45475 |
| 2003/0025562 A1 | * | 2/2003 | Andreou ............. H03F 3/45475 |
| | | | 330/308 |
| 2003/0086138 A1 | | 5/2003 | Pittman et al. |
| 2003/0235363 A1 | | 12/2003 | Pfeiffer |
| 2004/0243657 A1 | | 12/2004 | Goren et al. |
| 2007/0180586 A1 | | 8/2007 | Amin |
| 2008/0002993 A1 | * | 1/2008 | Kirkpatrick .......... H04B 10/697 |
| | | | 398/202 |
| 2008/0031566 A1 | | 2/2008 | Matsubara et al. |
| 2008/0212186 A1 | | 9/2008 | Zoller et al. |
| 2008/0273835 A1 | | 11/2008 | Popovic |
| 2009/0028554 A1 | | 1/2009 | Anderson et al. |
| 2010/0284703 A1 | * | 11/2010 | Suzuki ............... H04B 10/6933 |
| | | | 398/212 |
| 2011/0248150 A1 | * | 10/2011 | Bureau .................... G01D 5/26 |
| | | | 250/214.1 |
| 2013/0011093 A1 | | 1/2013 | Goh et al. |
| 2014/0241657 A1 | | 8/2014 | Manouvrier |
| 2014/0299743 A1 | | 10/2014 | Miller |
| 2015/0354938 A1 | | 12/2015 | Mower et al. |
| 2015/0382089 A1 | | 12/2015 | Mazed |
| 2016/0103281 A1 | | 4/2016 | Matsumoto |
| 2016/0118106 A1 | | 4/2016 | Yoshimura et al. |
| 2016/0162798 A1 | | 6/2016 | Marandi et al. |
| 2017/0031101 A1 | | 2/2017 | Miller |
| 2017/0285373 A1 | | 10/2017 | Zhang et al. |
| 2017/0351293 A1 | | 12/2017 | Carolan et al. |
| 2018/0274900 A1 | | 9/2018 | Mower et al. |
| 2018/0335574 A1 | | 11/2018 | Steinbrecher et al. |

FOREIGN PATENT DOCUMENTS

| | | |
|---|---|---|
| WO | 2005/029404 A2 | 3/2005 |
| WO | 2006/023067 A2 | 3/2006 |
| WO | 2008/069490 A1 | 6/2008 |
| WO | 2018/098230 A1 | 5/2018 |

OTHER PUBLICATIONS

PCT/US19/32111, Aug. 2, 2019, International Search Report and Written Opinion.

International Search Report and Written Opinion from International Application No. PCT/US2015/034500, dated Mar. 15, 2016, 7 pages.

International Search Report and Written Opinion for International Application No. PCT/US19/32111 dated Aug. 2, 2019.

Aaronson et al., Computational complexity of linear optics. Proceedings of the 43rd Annual ACM Symposium on Theory of Computing. 2011. 101 pages. ISBN 978-1-4503-0691-1.

Abu-Mostafa et al., Optical neural computers. Scientific American 256.3 (1987):88-95.

Albert et al., Statistical mechanics of com-plex networks. Reviews of Modern Physics. 2002;(74):47-97.

Almeida et al., All-optical control of light on a silicon chip. Nature. 2004;431:1081-1084.

Amir et al., Classical diffusion of a quantum particle in a noisy environment. Physical Review E. 2009;79. 5 pages. DOI: 10.1103/PhysRevE.79.050105.

Amit et al., Spin-glass models of neural networks. Physical Review A. 1985;32(2):1007-1018.

Anitha et al., Comparative Study of High performance Braun's multiplier using FPGAs. IOSR Journal of Electrontrics and Communication Engineering (IOSRJECE). 2012;1:33-37.

Appeltant et al., Information processing using a single dynamical node as complex system. Nature Communications. 2011. 6 pages. DOI: 10.1038/ncomms1476.

Arjovsky et al., Unitary Evolution Recurrent Neural Networks. arXiv: 1511.06464. 2016. 9 pages.

Aspuru-Guzik et al., Photonic quantum simulators. Nature Physics. 2012;8:285-291. DOI: 10.1038/NPHYS2253.

Aspuru-Guzik et al., Simulated Quantum Computation of Molecular Energies. Science. 2005;309:1704-7.

Atabaki et al., Integrating photonics with silicon nanoelectronics for the next generation of systems on a chip. Nature. 2018;556(7701):349-354. 10 pages. DOI: 10.1038/s41586-018-0028-z.

Baehr-Jones et al., A 25 Gb/s Silicon Photonics Platform. arXiv:1203.0767. 2012. 11 pages.

Bao et al., Atomic-Layer Graphene as a Saturable Absorber for Ultrafast Pulsed Lasers. 24 pages. 2009.

Bao et al., Monolayer graphene as a saturable absorber in a mode-locked laser. Nano Research. 2011;4:297-307. DOI: 10.1007/s12274-010-0082-9.

Barahona, On the computational complexity of Ising spin glass models. Journal of Physics A: Mathematical and General. 1982;15:3241-3253.

Bertsimas et al., Robust optimization with simulated annealing. Journal of Global Optimization. 2010;48:323-334. DOI: 10.1007/s10898-009-9496-x.

Bewick, Fast multiplication: algorithms and implementation. Ph.D. thesis, Stanford University. 1994.170 pages.

Bonneau et al., Quantum interference and manipulation of entanglement in silicon wire waveguide quantum circuits. New Journal of Physics. 2012;14:045003. 13 pages. DOI: 10.1088/1367-2630/14/4/045003.

Brilliantov, Effective magnetic Hamiltonian and Ginzburg criterion for fluids. Physical Review E. 1998;58:2628-2631.

Bromberg et al., Bloch oscillations of path-entangled photons. Physical Review Letters. 2010;105:263604-1-2633604-4. 4 pages. DOI: 10.1103/PhysRevLett.105.263604.

Bromberg et al., Quantum and Classical Correlations in Waveguide Lattices. Physical Review Letters. 2009;102:253904-1-253904-4. 4 pages. DOI: 10.1103/PhysRevLett.102.253904.

(56) References Cited

OTHER PUBLICATIONS

Broome et al., Photonic Boson Sampling in a Tunable Circuit. Science. 2012;339:794-8.
Bruck et al., On the power of neural networks for solving hard problems. American Institute of Physics. 1988. pp. 137-143. 7 pages.
Canziani et al., Evaluation of neural network architectures for embedded systems. Circuits and Systems (ISCAS). 2017 IEEE International Symposium. 4 pages.
Cardenas et al., Low loss etchless silicon photonic waveguides. Optics Express. 2009;17(6):4752-4757.
Carolan et al., Universal linear optics. Science. 2015;349:711-716.
Caves, Quantum-mechanical noise in an interferometer. Physical Review D. 1981;23(8):1693-1708. 16 pages.
Centeno et al., Optical bistability in finite-size nonlinear bidimensional photonic crystals doped by a microcavity. Physical Review B. 2000;62(12):R7683-R7686.
Chan, Optical flow switching networks. Proceedings of the IEEE. 2012;100(5):1079-1091.
Chen et al., Compact, low-loss and low-power 8×8 broadband silicon optical switch. Optics Express. 2012;20(17):18977-18985.
Chen et al., DianNao: A small-footprint high-throughput accelerator for ubiquitous machine-learning. ACM Sigplan Notices. 2014;49:269-283.
Chen et al., Efficient photon pair sources based on silicon-on-insulator microresonators. Proc. of SPIE. 2010;7815. 10 pages.
Chen et al., Frequency-bin entangled comb of photon pairs from a Silicon-on-Insulator microresonator. Optics Express. 2011;19(2):1470-1483.
Chen et al., Universal method for constructing N-port nonblocking optical router based on 2×2 optical switch for photonic networks-on-chip. Optics Express. 2014;22(10);12614-12627. DOI: 10.1364/OE.22.012614.
Cheng et al., In-Plane Optical Absorption and Free Carrier Absorption in Graphene-on-Silicon Waveguides. IEEE Journal of Selected Topics in Quantum Electronics. 2014;20(1). 6 pages.
Chetlur et al., cuDNN: Efficient primitives for deep learning. arXiv preprint arXiv:1410.0759. 2014. 9 pages.
Childs et al., Spatial search by quantum walk. Physical Review A. 2004;70(2):022314. 11 pages.
Chung et al., A monolithically integrated large-scale optical phased array in silicon-on-insulator cmos. IEEE Journal of Solid-State Circuits. 2018;53:275-296.
Cincotti, Prospects on planar quantum computing. Journal of Lightwave Technology. 2009;27(24):5755-5766.
Clements et al., Optimal design for universal multiport interferometers. Optica. 2016;3(12):1460-1465.
Crespi et al., Integrated multimode interferometers with arbitrary designs for photonic boson sampling. Nature Photonics. 2013;7:545-549. DOI: 10.1038/NPHOTON.2013.112.
Crespi, et al., Anderson localization of entangled photons in an integrated quantum walk. Nature Photonics. 2013;7:322-328. DOI: 10.1038/NPHOTON.2013.26.
Dai et al., Novel concept for ultracompact polarization splitter-rotator based on silicon nanowires. Optics Express. 2011;19(11):10940-9.
Di Giuseppe et al., Einstein-Podolsky-Rosen Spatial Entanglement in Ordered and Anderson Photonic Lattices. Physical Review Letters. 2013;110:150503-1-150503-5. DOI: 10.1103/PhysRevLett.110.150503.
Dunningham et al., Efficient comparison of path-lengths using Fourier multiport devices. Journal of Physics B: Atomic, Molecular and Optical Physics. 2006;39:1579-1586. DOI: 10.1088/0953-4075/39/7/002.
Esser et al., Convolutional networks for fast, energy-efficient neuromorphic computing. Proceedings of the National Academy of Sciences. 2016:113(41):11441-11446.
Farht et al., Optical implementation of the Hopfield model. Applied Optics. 1985;24(10):1469-1475.
Feinberg et al., Making memristive neural network accelerators reliable. IEEE International Symposium on High Performance Computer Architecture (HPCA). 2018. pp. 52-65. DOI 10.1109/HPCA.2018.00015.
Fushman et al., Controlled Phase Shifts with a Single Quantum Dot. Science. 2008;320:769-772. DOI: 10.1126/science.1154643.
George et al., A programmable and configurable mixed-mode FPAA SoC. IEEE Transactions on Very Large Scale Integration (VLSI) Systems. 2016;24:2253-2261.
Gilmer et al., Neural message passing for quantum chemistry. arXiv preprint arXiv:1704.01212. Jun. 2017. 14 pages.
Golub et al., Calculating the singular values and pseudo-inverse of a matrix. Journal of the Society for Industrial and Applied Mathematics Series B Numerical Analysis. 1965;2(2):205-224.
Graves et al., Hybrid computing using a neural network with dynamic external memory. Nature. 2016;538. 21 pages. DOI:10.1038/nature20101.
Grote et al., First long-term application of squeezed states of light in a gravitational-wave observatory. Physical Review Letter. 2013;110:181101. 5 pages. DOI:10.1103/PhysRevLett.110.181101.
Gruber et al., Planar-integrated optical vector-matrix multiplier. Applied Optics. 2000;39(29):5367-5373.
Gullans et al., Single-Photon Nonlinear Optics with Graphene Plasmons. Physical Review Letter. 2013;111:247401-1-247401-5. DOI: 10.1103/PhysRevLett.111.247401.
Gunn, CMOS photonics for high-speed interconnects. IEEE Micro. 2006;26:58-66.
Haffner et al., Low-loss plasmon-assisted electro-optic modulator. Nature. 2018;556:483-486. 17 pages. DOI: 10.1038/s41586-018-0031-4.
Halasz et al., Phase diagram of QCD. Physical Review D. 1998;58:096007. 11 pages.
Hamerly et al., Scaling advantages of all-to-all connectivity in physical annealers: the Coherent Ising Machine vs. D-Wave 2000Q. arXiv preprints, May 2018. 17 pages.
Harris et al. Efficient, Compact and Low Loss Thermo-Optic Phase Shifter in Silicon. Optics Express. 2014;22(9);10487-93. DOI:10.1364/OE.22.010487.
Harris et al., Bosonic transport simulations in a large-scale programmable nanophotonic processor. arXiv:1507.03406. 2015. 8 pages.
Harris et al., Integrated source of spectrally filtered correlated photons for large-scale quantum photonic systems. Physical Review X. 2014;4:041047. 10 pages. DOI: 10.1103/PhysRevX.4.041047.
Harris et al., Quantum transport simulations in a programmable nanophotonic processor. Nature Photonics. 2017;11:447-452. DOI: 10.1038/NPHOTON.2017.95.
Hinton et al., Reducing the dimensionality of data with neural networks. Science. 2006;313:504-507.
Hochberg et al., Silicon Photonics: The Next Fabless Semiconductor Industry. IEEE Solid-State Circuits Magazine. 2013. pp 48-58. DOI: 10.1109/MSSC.2012.2232791.
Honerkamp-Smith et al., An introduction to critical points for biophysicists; observations of compositional heterogeneity in lipid membranes. Biochimica et Biophysica Acta (BBA). 2009;1788:53-63. DOI: 10.1016/j.bbamem.2008.09.010.
Hong et al., Measurement of subpicosecond time intervals between two photons by interference. Physical Review Letters. 1987;59(18):2044-2046.
Hopefield et al., Neural computation of decisions in optimization problems. Biological Cybernetics. 1985;52;141-152.
Hopefield, Neural networks and physical systems with emergent collective computational abilities. PNAS. 1982;79:2554-2558. DOI: 10.1073/pnas.79.8.2554.
Horowitz, Computing's energy problem (and what we can do about it). Solid-State Circuits Conference Digest of Technical Papers (ISSCC), 2014 IEEE International. 5 pages.
Horst et al., Cascaded Mach-Zehnder wavelength filters in silicon photonics for low loss and flat pass-band WDM (de-)multiplexing. Optics Express. 2013;21(10):11652-8. DOI:10.1364/OE.21.011652.

(56) References Cited

OTHER PUBLICATIONS

Humphreys et al., Linear Optical Quantum Computing in a Single Spatial Mode. Physical Review Letters. 2013;111:150501. 5 pages. DOI: 10.1103/PhysRevLett.111.150501.

Inagaki et al., Large-scale ising spin network based on degenerate optical parametric oscillators. Nature Photonics. 2016;10:415-419. 6 pages. DOI: 10.1038/NPHOTON.2016.68.

Isichenko, Percolation, statistical topography, and trans-port in random media. Reviews of Modern Physics. 1992;64(4):961-1043.

Jaekel et al., Quantum limits in interferometric measurements. Europhysics Letters. 1990;13(4):301-306.

Jalali et al., Silicon Photonics. Journal of Lightwave Technology. 2006;24(12):4600-15. DOI: 10.1109/JLT.2006.885782.

Jia et al., Caffe: Convolutional architecture for fast feature embedding. Proceedings of the 22nd ACM International Conference on Multimedia. Nov. 2014. 4 pages. URL:http://doi.acm.org/10.1145/2647868.2654889.

Jiang et al., A planar ion trapping microdevice with integrated waveguides for optical detection. Optics Express. 2011;19(4):3037-43.

Jonsson, An empirical approach to finding energy efficient ADC architectures. 2011 International Workshop on ADC Modelling, Testing and Data Converter Analysis and Design and IEEE 2011 ADC Forum. 6 pages.

Jouppi et al. In-datacenter performance analysis of a tensor processing unit. Proceeding of Computer Architecture (ISCA). Jun. 2017. 12 pages. URL:https://doi.org/10.1145/3079856.3080246.

Kahn et al., Communications expands its space. Nature Photonics. 2017;11:5-8.

Kardar et al., Dynamic Scaling of Growing Interfaces. Physical Review Letters. 1986;56(9):889-892.

Karpathy, CS231n Convolutional Neural Networks for Visual Recognition. Class notes. 2019. URL:http://cs231n.github.io/ 2 pages, [last accessed Sep. 24, 2019].

Keckler et al., GPUs and the future of parallel computing. IEEE Micro. 2011;31:7-17. DOI: 10.1109/MM.2011.89.

Kieling et al., On photonic Controlled Phase Gates. New Journal of Physics. 2010;12:0133003. 17 pages. DOI: 10.1088/1367-2630/12/1/013003.

Kilper et al., Optical networks come of age. Optics Photonics News. 2014;25:50-57. DOI: 10.1364/OPN.25.9.000050.

Kim et al., A functional hybrid memristor crossbar-array/cmos system for data storage and neuromorphic applications. Nano Letters. 2011;12:389-395.

Kirkpatrick et al., Optimization by simulated annealing. Science. 1983;220(4598):671-680.

Knill et al., A scheme for efficient quantum computation with linear optics. Nature. 2001;409(4652):46-52.

Knill et al., The Bayesian brain: the role of uncertainty in neural coding and computation. Trends in Neurosciences. 2004;27(12):712-719.

Knill, Quantum computing with realistically noisy devices. Nature. 2005;434:39-44.

Kok et al., Linear optical quantum computing with photonic qubits. Reviews of Modern Physics. 2007;79(1):135-174.

Koos et al., Silicon-organic hybrid (SOH) and plasmonic-organic hybrid (POH) integration. Journal of Lightwave Technology. 2016;34(2):256-268.

Krizhevsky et al., ImageNet classification with deep convolutional neural networks. Advances in Neural Information Processing Systems (NIPS). 2012. 9 pages.

Kucherenko et al., Application of Deterministic Low-Discrepancy Sequences in Global Optimization. Computational Optimization and Applications. 2005;30:297-318.

Kwack et al., Monolithic InP strictly non-blocking 8×8 switch for high-speed WDM optical interconnection. Optics Express. 2012;20(27):28734-41.

Lahini et al., Anderson Localization and Nonlinearity in One-Dimensional Disordered Photonic Lattices. Physical Review Letters. 2008;100:013906. 4 pages. DOI: 10.1103/PhysRevLett.100.013906.

Lahini et al., Quantum Correlations in Two-Particle Anderson Localization. Physical Review Letters. 2010;105:163905. 4 pages. DOI: 10.1103/PhysRevLett.105.163905.

Laing et al., High-fidelity operation of quantum photonic circuits. Applied Physics Letters. 2010;97:211109. 5 pages. DOI: 10.1063/1.3497087.

Landauer, Irreversibility and heat generation in the computing process. IBM Journal of Research and Development. 1961. pp. 183-191.

Lanyon et al., Towards quantum chemistry on a quantum computer. Nature Chemistry. 2010;2:106-10. DOI: 10.1038/NCHEM.483.

Lawson et al., Basic linear algebra subprograms for Fortran usage. ACM Transactions on Mathematical Software (TOMS). 1979;5(3):308-323.

Lecun et al., Deep learning. Nature. 2015;521:436-444. DOI:10.1038/nature14539.

Lecun et al., Gradient-based learning applied to document recognition. Proceedings of the IEEE. Nov. 1998. 46 pages.

Levi et al., Hyper-transport of light and stochastic acceleration by evolving disorder. Nature Physics. 2012;8:912-7. DOI: 10.1038/NPHYS2463.

Li et al., Efficient and self-adaptive in-situ learning in multilayer memristor neural networks. Nature Communications. 2018;9:2385. 8 pages. DOI: 10.1038/s41467-018-04484-2.

Lin et al., All-optical machine learning using diffractive deep neural networks. Science. 2018;361:1004-1008. 6 pages. DOI: 10.1126/science.aat8084.

Little, The existence of persistent states in the brain. Mathematical Biosciences. 1974;19:101-120.

Lu et al., 16 × 16 non-blocking silicon optical switch based on electro-optic Mach-Zehnder interferometers. Optics Express. 2016;24(9):9295-9307. DOI: 10.1364/OE.24.009295.

Ma et al., Optical switching technology comparison: Optical mems vs. Other technologies. IEEE Optical Communications. 2003;41(11):S16-S23.

Macready et al., Criticality and Parallelism in Combinatorial Optimization. Science. 1996;271:56-59.

Marandi et al., Network of time-multiplexed optical parametric oscillators as a coherent Ising machine. Nature Photonics. 2014;8:937-942. DOI: 10.1038/NPHOTON.2014.249.

Martin-Lopez et al., Experimental realization of Shor's quantum factoring algorithm using qubit recycling. Nature Photonics. 2012;6:773-6. DOI: 10.1038/NPHOTON.2012.259.

McMahon et al., A fully programmable 100-spin coherent Ising machine with all-to-all connections. Science. 2016;354(6312):614-7. DOI: 10.1126/science.aah5178.

Mead, Neuromorphic electronic systems. Proceedings of the IEEE. 1990;78(10):1629-1636.

Migdall et al., Tailoring single-photon and multiphoton probabilities of a single-photon on-demand source. Physical Review A. 2002;66:053805. 4 pages. DOI: 10.1103/PhysRevA.66.053805.

Mikkelsen et al., Dimensional variation tolerant silicon-on-insulator directional couplers. Optics Express. 2014;22(3):3145-50. DOI:10.1364/OE.22.003145.

Miller, Are optical transistors the logical next step? Nature Photonics. 2010;4:3-5.

Miller, Attojoule optoelectronics for low-energy information processing and communications. Journal of Lightwave Technology. 2017;35(3):346-96. DOI: 10.1109/JLT.2017.2647779.

Miller, Energy consumption in optical modulators for interconnects. Optics Express. 2012;20(S2):A293-A308.

Miller, Perfect optics with imperfect components. Optica. 2015;2(8):747-750.

Miller, Reconfigurable add-drop multiplexer for spatial modes. Optics Express. 2013;21(17):20220-9. DOI:10.1364/OE.21.020220.

Miller, Self-aligning universal beam coupler, Optics Express. 2013;21(5):6360-70.

(56) References Cited

OTHER PUBLICATIONS

Miller, Self-configuring universal linear optical component [Invited]. Photonics Research. 2013;1(1):1-15. URL:http://dx.doi.org/10.1364/PRJ.1.000001.

Misra et al., Artificial neural networks in hardware: A survey of two decades of progress. Neurocomputing. 2010;74:239-255.

Mohseni et al., Environment-assisted quantum walks in photosynthetic complexes. The Journal of Chemical Physics. 2008;129:174106. 10 pages. DOI: 10.1063/1.3002335.

Moore, Cramming more components onto integrated circuits. Proceeding of the IEEE. 1998;86(1):82-5.

Mower et al., Efficient generation of single and entangled photons on a silicon photonic integrated chip. Physical Review A. 2011;84:052326. 7 pages. DOI: 10.1103/PhysRevA.84.052326.

Mower et al., High-fidelity quantum state evolution in imperfect photonic integrated circuits. Physical Review A. 2015;92(3):032322. 7 pages. DOI: 10.1103/PhysRevA.92.032322.

Nagamatsu et al., A 15 NS 32×32-bit CMOS multiplier with an improved parallel structure. IEEE Custom Integrated Circuits Conference. 1989. 4 pages.

Najafi et al., On-Chip Detection of Entangled Photons by Scalable Integration of Single-Photon Detectors. arXiv:1405.4244. May 16, 2014. 27 pages.

Najafi et al., On-Chip detection of non-classical light by scalable integration of single-photon detectors. Nature Communications. 2015;6:5873. 8 pages. DOI: 10.1038/ncomms6873.

Naruse, Nanophotonic Information Physics. Nanointelligence and Nanophotonic Computing. Springer. 2014. 261 pages. DOI 10.1007/978-3-642-40224-1.

Nozaki et al., Sub-femtojoule all-optical switching using a photonic-crystal nanocavity. Nature Photonics. 2010;4:477-483. DOI: 10.1038/NPHOTON.2010.89.

O'BRIEN et al., Demonstration of an all-optical quantum controlled-NOT gate. Nature. 2003;426:264-7.

Onsager, Crystal Statistics. I. A Two-Dimensional Model with an Order-Disorder Transition. Physical Review. 1944;65(3,4):117-149.

Orcutt et al., Nanophotonic integration in state-of-the-art CMOS foundries. Optics Express. 2011;19(3):2335-46.

Pelissetto et al., Critical phenomena and renormalization-group theory. Physics Reports. Apr. 2002. 150 pages.

Peng, Implementation of AlexNet with Tensorflow. https://github.com/ykpengba/AlexNet-A-Practical-Implementation. 2018. 2 pages, [last accessed Sep. 24, 2019].

Peretto, Collective properties of neural networks: A statistical physics approach. Biological Cybernetics. 1984;50:51-62.

Pernice et al., High-speed and high-efficiency travelling wave single-photon detectors embedded in nanophotonic circuits. Nature Communications 2012;3:1325. 10 pages. DOI: 10.1038/ncomms2307.

Peruzzo et al., Quantum walk of correlated photons. Science. 2010;329;1500-3. DOI: 10.1126/science.1193515.

Politi et al., Integrated Quantum Photonics, IEEE Journal of Selected Topics in Quantum Electronics, 2009;5(6):1-12. DOI: 10.1109/JSTQE.2009.2026060.

Politi et al., Silica-on-Silicon Waveguide Quantum Circuits. Science. 2008;320:646-9. DOI: 10.1126/science.1155441.

Poon et al., Neuromorphic silicon neurons and large-scale neural networks: challenges and opportunities. Frontiers in Neuroscience. 2011;5:1-3. DOI: 10.3389/fnins.2011.00108.

Prucnal et al., Recent progress in semiconductor excitable lasers for photonic spike processing. Advances in Optics and Photonics. 2016;8(2):228-299.

Psaltis et al., Holography in artificial neural networks. Nature. 1990;343:325-330.

Qiao et al., 16×16 non-blocking silicon electro-optic switch based on mach zehnder interferometers. Optical Fiber Communication Conference. Optical Society of America. 2016. 3 pages.

Ralph et al., Linear optical controlled-NOT gate in the coincidence basis. Physical Review A. 2002;65:062324-1-062324-5. DOI: 10.1103/PhysRevA.65.062324.

Ramanitra et al., Scalable and multi-service passive optical access infrastructure using variable optical splitters. Optical Fiber Communication Conference. Optical Society of America. 2005. 3 pages.

Raussendorf et al., A one-way quantum computer. Physical Review Letter. 2001;86(22):5188-91. DOI: 10.1103/PhysRevLett.86.5188.

Rechtsman et al., Photonic floquet topological insulators. Nature. 2013;496:196-200. doi: 10.1038/nature12066.

Reck et al., Experimental realization of any discrete unitary operator. Physical review letters. 1994;73(1):58-61. 6 pages.

Reed et al., Silicon optical modulators. Nature Photonics. 2010;4:518-26. DOI: 10.1038/NPHOTON.2010.179.

Rendl et al., Solving Max-Cut to optimality by intersecting semidefinite and polyhedral relaxations. Mathematical Programming. 2010;121:307-335. DOI: 10.1007/s10107-008-0235-8.

Rios et al., Integrated all-photonic non-volatile multilevel memory. Nature Photonics. 2015;9:725-732. DOI: 10.1038/NPHOTON.2015.182.

Rogalski, Progress in focal plane array technologies. Progress in Quantum Electronics. 2012;36:342-473.

Rohit et al., 8×8 space and wavelength selective cross-connect for simultaneous dynamic multi-wavelength routing. Optical Fiber Communication Conference. OFC/NFOEC Technical Digest. 2013. 3 pages.

Rosenblatt, The perceptron: a probabilistic model for information storage and organization in the brain. Psychological Review. 1958;65(6):386-408.

Russakovsky et al., ImageNet Large Scale Visual Recognition Challenge. arXiv:1409.0575v3. Jan. 2015. 43 pages.

Saade et al., Random projections through multiple optical scattering: Approximating Kernels at the speed of light. arXiv:1510.06664v2. Oct. 25, 2015. 6 pages.

Salandrino et al., Analysis of a three-core adiabatic directional coupler. Optics Communications. 2009;282:4524-6. DOI:10.1016/j.optcom.2009.08.025.

Schaeff et al., Scalable fiber integrated source for higher-dimensional path-entangled photonic quNits. Optics Express. 2012;20(15):16145-153.

Schirmer et al., Nonlinear mirror based on two-photon absorption. Journal of the Optical Society of America B. 1997;14(11):2865-8.

Schmidhuber, Deep learning in neural networks: An overview. Neural Networks. 2015;61:85-117.

Schreiber et al., Decoherence and Disorder in Quantum Walks: From Ballistic Spread to Localization. Physical Review Letters. 2011;106:180403. 4 pages. DOI: 10.1103/PhysRevLett.106.180403.

Schwartz et al., Transport and Anderson localization in disordered two-dimensional photonic lattices. Nature. 2007;446:52-5. DOI:10.1038/nature05623.

Selden, Pulse transmission through a saturable absorber. British Journal of Applied Physics. 1967;18:743-8.

Shafiee et al., ISAAC: A convolutional neural network accelerator with in-situ analog arithmetic in crossbars. ACM/IEEE 43rd Annual International Symposium on Computer Architecture. Oct. 2016. 13 pages.

Shen et al., Deep learning with coherent nanophotonic circuits. Nature Photonics. 2017;11:441-6. DOI: 10.1038/NPHOTON.2017.93.

Shoji et al., Low-crosstalk 2×2 thermo-optic switch with silicon wire waveguides. Optics Express.2010;18(9):9071-5.

Silver et al. Mastering chess and shogi by self-play with a general reinforcement learning algorithm. arXiv preprint arXiv:1712.01815. 19 pages. 2017.

Silver et al., Mastering the game of go with deep neural networks and tree search. Nature. 2016;529:484-9. 20 pages. DOI:10.1038/nature16961.

Silver et al., Mastering the game of Go without human knowledge. Nature. 2017;550:354-9. 18 pages. DOI:10.1038/nature24270.

Silverstone et al., On-chip quantum interference between silicon photon-pair sources. Nature Photonics. 2014;8:104-8. DOI: 10.1038/NPHOTON.2013.339.

Smith et al., Phase-controlled integrated photonic quantum circuits. Optics Express. 2009;17(16):13516-25.

(56) References Cited

OTHER PUBLICATIONS

Soljacic et al., Optimal bistable switching in nonlinear photonic crystals. Physical Review E. vol. 66, p. 055601, Nov. 2002. 4 pages.

Solli et al., Analog optical computing. Nature Photonics. 2015;9:704-6.

Spring et al., Boson sampling on a photonic chip. Science. 2013;339:798-801. DOI: 10.1126/science.1231692.

Srinivasan et al., 56 Gb/s germanium waveguide electro-absorption modulator. Journal of Lightwave Technology. 2016;34(2):419-24. DOI: 10.1109/JLT.2015.2478601.

Steinkraus et al., Using GPUs for machine learning algorithms. Proceedings of the 2005 Eight International Conference on Document Analysis and Recognition. 2005. 6 pages.

Suda et al., Quantum interference of photons in simple networks. Quantum Information Process. 2013;12:1915-45. DOI: 10.1007/s11128-012-0479-3.

Sun et al., Large-scale nanophotonic phased array. Nature. 2013;493:195-9. DOI: 10.1038/nature11727.

Sun et al., Single-chip microprocessor that communicates directly using light. Nature. 2015;528:534-8. DOI: 10.1038/nature16454.

Suzuki et al., Ultra-compact 8×8 strictly-non-blocking Si-wire PILOSS switch. Optics Express. 2014;22(4):3887-94. DOI: 10.1364/OE.22.003887.

Sze et al., Efficient processing of deep neural networks: A tutorial and survey. Proceedings of the IEEE. 2017;105(12):2295-2329. DOI: 10.1109/JPROC.2017.276174.

Tabia, Experimental scheme for qubit and qutrit symmetric informationally complete positive operator-valued measurements using multiport devices. Physical Review A. 2012;86:062107. 8 pages. DOI: 10.1103/PhysRevA.86.062107.

Tait et al., Broadcast and weight: An integrated network for scalable photonic spike processing. Journal of Lightwave Technology. 2014;32(21):3427-39. DOI: 10.1109/JLT.2014.2345652.

Tait et al., Chapter 8 Photonic Neuromorphic Signal Processing and Computing. Springer, Berlin, Heidelberg. 2014. pp. 183-222.

Tait et al., Neuromorphic photonic networks using silicon photonic weight banks. Scientific Reports. 2017;7:7430. 10 pages.

Tanabe et al., Fast bistable all-optical switch and memory on a silicon photonic crystal on-chip. Optics Letters. 2005;30(19):2575-7.

Tanizawa et al., Ultra-compact 32×32 strictly-non-blocking Si-wire optical switch with fan-out LGA interposer. Optics Express. 2015;23(13):17599-606. DOI:10.1364/OE.23.017599.

Thompson et al., Integrated waveguide circuits for optical quantum computing. IET Circuits, Devices, & Systems. 2011;5(2):94-102. DOI: 10.1049/iet-cds.2010.0108.

Timurdogan et al., An ultralow power athermal silicon modulator. Nature Communications. 2014;5:4008. 11 pages. DOI: 10.1038/ncomms5008.

Vandoorne et al., Experimental demonstration of reservoir computing on a silicon photonics chip. Nature Communications. 2014;5:3541. 6 pages. DOI: 10.1038/ncomms4541.

Vazquez et al., Optical NP problem solver on laser-written waveguide plat-form. Optics Express. 2018;26(2):702-10.

Vivien et al., Zero-bias 40gbit/s germanium waveguide photodetector on silicon. Optics Express. 2012;20(2):1096-1101.

Wang et al., Coherent Ising machine based on degenerate optical parametric oscillators. Physical Review A. 2013;88:063853. 9 pages. DOI: 10.1103/PhysRevA.88.063853.

Wang et al., Deep learning for identifying metastatic breast cancer. arXiv preprint arXiv:1606.05718. Jun. 18, 2016. 6 pages.

Werbos, Beyond regression: New tools for prediction and analysis in the behavioral sciences. Ph.D. dissertation, Harvard University. Aug. 1974. 454 pages.

Whitfield et al., Simulation of electronic structure Hamiltonians using quantum computers. Molecular Physics. 2010;109(5,10):735-50. DOI: 10.1080/00268976.2011.552441.

Wu et al., An optical fiber network oracle for NP-complete problems. Light: Science & Applications. 2014;3: e147. 5 pages. DOI: 10.1038/lsa.2014.28.

Xia et al., Mode conversion losses in silicon-on-insulator photonic wire based racetrack resonators. Optics Express. 2006;14(9):3872-86.

Xu et al., Experimental observations of bistability and instability in a two-dimensional nonlinear optical superlattice. Physical Review Letters. 1993;71(24):3959-62.

Yang et al., Non-Blocking 4×4 Electro-Optic Silicon Switch for On-Chip Photonic Networks. Optics Express 2011;19(1):47-54.

Yao et al., Serial-parallel multipliers. Proceedings of 27th Asilomar Conference on Signals, Systems and Computers. 1993. pp. 359-363.

Young et al., Recent trends in deep learning based natural language processing. IEEE Computational Intelligence Magazine. arXiv:1708.02709v8. Nov. 2018. 32 pages.

Zhou et al., Calculating Unknown Eigenvalues with a Quantum Algorithm. Nature Photonics. 2013;7:223-8. DOI: 10.1038/NPHOTON.2012.360.

\* cited by examiner

OPTICAL DIFFERENTIAL LOW-NOISE RECEIVERS AND RELATED METHODS

CROSS-REFERENCE TO RELATED APPLICATIONS

This application claims priority under 35 U.S.C. § 119(e) to U.S. Provisional Patent Application Ser. No. 62/793,327, entitled "DIFFERENTIAL, LOW-NOISE HOMODYNE RECEIVER," filed on Jan. 16, 2019, which is hereby incorporated herein by reference in its entirety.

BACKGROUND

Photodetectors are sensors configured to generate electric signals responsive to reception of light. In optical communications, photodetectors are often used to detect optical signals. For example, a photodetector can be connected to an end of an optical fiber to detect optical signals traveling down the fiber.

SUMMARY OF THE DISCLOSURE

Some embodiments relate to an optical receiver comprising a differential amplifier having first and second inputs and first and second outputs; first and second photodetectors coupled to the first input of the differential amplifier; and third and fourth photodetectors coupled to the second input of the differential amplifier.

In some embodiments, an anode of the first photodetector is coupled to a cathode of the second photodetector.

In some embodiments, the anode of the first photodetector and the cathode of the second photodetector are coupled to the first input of the differential amplifier.

In some embodiments, a cathode of the third photodetector is coupled to an anode of the fourth photodetector.

In some embodiments, the cathode of the third photodetector and the anode of the fourth photodetector are coupled to the second input of the differential amplifier.

In some embodiments, the first, second, third and fourth photodetectors are formed monolithically on a common substrate.

In some embodiments, the common substrate comprises a silicon substrate.

In some embodiments, the first, second, third and fourth photodetectors are disposed within an area of 0.1 mm$^2$ on the substrate.

In some embodiments, the first, second, third and fourth photodetectors have equal responsivities.

In some embodiments, the first, second, third and fourth photodetectors are photodiodes.

In some embodiments, the optical receiver further comprises an analog-to-digital converter coupled to the first and second outputs of the differential amplifier.

In some embodiments, the optical receiver further comprises a photonic circuit configured to provide: a first optical signal to the first and third photodetectors, and a second optical signal to the second and fourth photodetectors.

In some embodiments, the photonic circuit is configured to generate the first and second optical signals by combining a modulated optical signal with a reference optical signal.

Some embodiments relate to a method for receiving an input signal, the method comprising combining the input signal with a reference signal to obtain first and second optical signals; detecting the first optical signal with a first photodetector and with a second photodetector and detecting the second optical signal with a third photodetector and with a fourth photodetector to produce a pair of differential currents; and producing a pair of amplified differential voltages using the pair of differential currents.

In some embodiments, detecting the first optical signal with the first photodetector and with the second photodetector and detecting the second optical signal with the third photodetector and with the fourth photodetector to produce the pair of differential currents comprises: producing a first photocurrent with the first photodetector; producing a second photocurrent with the second photodetector; producing a third photocurrent with the third photodetector; producing a fourth photocurrent with the fourth photodetector; and subtracting the first photocurrent from the third photocurrent and subtracting the second photocurrent from the fourth photocurrent.

In some embodiments, combining the input signal with the reference signal comprises combining the input signal with the reference signal with a directional coupler.

In some embodiments, producing the pair of amplified differential voltages using the pair of differential currents comprises producing the pair of amplified differential voltages using the pair of differential currents with a differential operational amplifier.

Some embodiments relate to a method for fabricating an optical receiver, the method comprising: fabricating first, second, third and fourth photodetectors; and fabricating a differential operational amplifier with first and second inputs and first and second outputs such that the first and second photodetectors are coupled to the first input and the third and fourth photodetectors are coupled to the second input.

In some embodiments, fabricating the first, second, third and fourth photodetectors comprises fabricating the first, second, third and fourth photodetectors on a first substrate; and fabricating the differential operational amplifier comprises fabricating the differential operational amplifier on a second substrate and bonding the first substrate to the second substrate.

In some embodiments, bonding the first substrate to the second substrate comprises wire bonding the first substrate to the second substrate or flip-chip bonding the first substrate to the second substrate.

In some embodiments, the method further comprises fabricating a photonic circuit configured to provide a first optical signal to the first and third photodetectors and a second optical signal to the second and fourth photodetectors.

In some embodiments, fabricating the first, second, third and fourth photodetectors comprises fabricating the first, second, third and fourth photodetectors on a first substrate, and fabricating the differential operational amplifier comprises fabricating the differential operational amplifier on the first substrate.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

The inventors have recognized and appreciated that some conventional optical receivers are particularly susceptible to noise generated from voltage supplies, to noise arising from the fact that photodetectors inevitably produce dark currents, and to other forms of noise. The presence of noise reduces the signal-to-noise ratio, and therefore, the ability of these photodetectors to accurately sense incoming optical signals. This can negatively affect the performance of the system in which these photodetectors are deployed. For example, this can negatively affect the system's bit error rate and power budget.

The inventors have developed optical receivers with reduced susceptibility to noise. Some embodiments of the present application are directed to optical receivers in which both the optical-to-electric conversion and the amplification are performed in a differential fashion. In the optical receivers described herein, two separate signal subtractions take place. First, the photocurrents are subtracted from one another to produce a pair of differential currents. Then, the resulting differential currents are further subtracted from each other to produce an amplified differential output. The inventors have recognized and appreciated that having an optical receiver involving multiple levels of signal subtraction results in multiple levels of noise cancellation, thus substantially reducing noise from the system. This can have several advantages over conventional optical receivers, including wider dynamic range, greater signal-to-noise ratio, larger output swing, and increased supply-noise immunity.

Optical receivers of the types described herein can be used in a variety of settings, including for example in telecom and datacom (including local area networks, metropolitan area networks, wide area networks, data center networks, satellite networks, etc.), analog applications such as radio-over-fiber, all-optical switching, Lidar, phased arrays, coherent imaging, machine learning and other types of artificial intelligence applications, as well as other applications. In some embodiments, optical receivers of the types described herein may be used as part of a photonic processing system.

Figure 1:
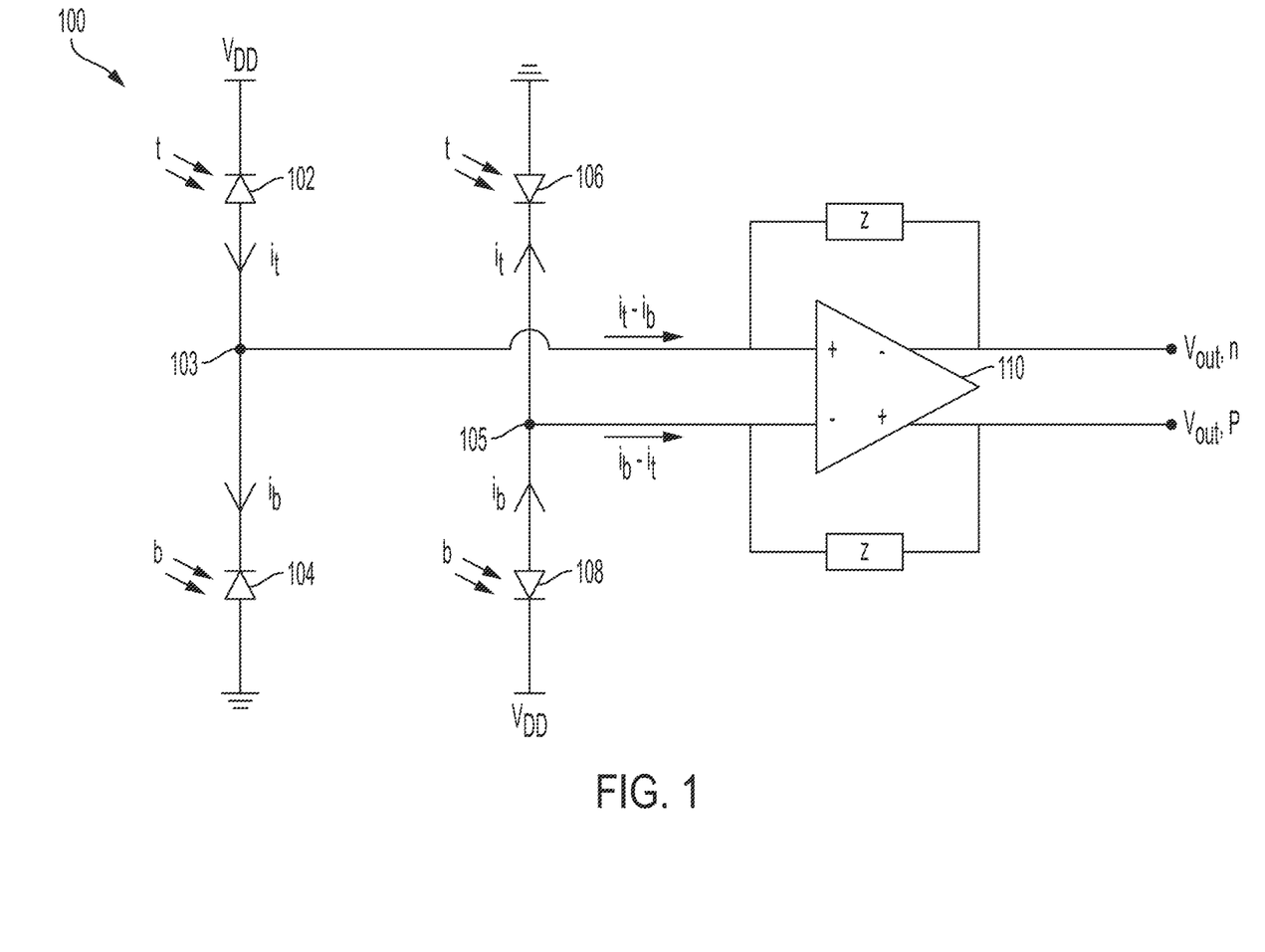
FIG. 1 is a circuit diagram illustrating an example of a differential optical receiver, in accordance with some non-limiting embodiments.

FIG. 1 illustrates a non-limiting example of an optical receiver 100, in accordance with some non-limiting embodiments of the present application. As shown, optical receiver 100 includes photodetectors 102, 104, 106 and 108, though other implementations include more than four photodetectors. Photodetector 102 may be connected to photodetector 104, and photodetector 106 may be connected to photodetector 108. In some embodiments, the anode of photodetector 102 is connected to the cathode of photodetector 104 (at node 103), and the cathode of photodetector 106 is connected to the anode of photodetector 108 (at node 105). In the example of FIG. 1, the cathodes of photodetectors 102 and 108 are connected to voltage supply $V_{DD}$ and the anodes of photodetectors 104 and 106 are connected to the reference potential (e.g., to ground). The opposite arrangement is also possible in some embodiments. The reference potential may be at a potential equal to zero or having any suitable value, such as $-V_{DD}$. $V_{DD}$ may have any suitable value.

Photodetectors 102-108 may be implemented in any of numerous ways, including for example with pn-junction photodiodes, pin-junction photodiodes, avalanche photodiodes, phototransistors, photoresistors, etc. The photodetectors may include a material capable of absorbing light at the wavelength of interest. For example, at wavelengths in the O-band, C-band or L-band, the photodetectors may have an absorption region made at least in part of germanium, by way of a non-limiting example. For visible light, the photodetectors may have an absorption region made at least in part of silicon, by way of another non-limiting example.

Photodetectors 102-108 may be integrated components formed monolithically as part of the same substrate. The substrate may be a silicon substrate in some embodiments, such as a bulk silicon substrate or a silicon-on-insulator. Other types of substrates can also be used, including for example indium phosphide or any suitable semiconductor material. To reduce variability in the characteristics of the photodetectors due to fabrication tolerances, in some embodiments, the photodetectors may be positioned in close proximity to one another. For example, the photodetectors may be positioned on a substrate within an area of 1 mm² or less, 0.1 mm² less or 0.01 mm² or less.

As further illustrated in FIG. 1, photodetectors 102-108 are connected to a differential operational amplifier 110. For example, photodetectors 102 and 104 may be connected to the non-inverting input ("+") of DOA 110 and photodetectors 106 and 108 may be connected to the inverting input ("−") of DOA 110. DOA 110 has a pair of outputs. One output is inverting and one output is non-inverting.

In some embodiments, as will be described in detail in connection with FIG. 2, photodetectors 102 and 106 may be arranged to receive the same optical signal "t" and photodetectors 104 and 108 may be arranged to receive the same optical signal "b." In some embodiments, photodetectors 102-108 may be designed to be substantially equal to each other. For example, photodetectors 102-108 may be formed using the same process steps and using the same photomask patterns. In these embodiments, photodetectors 102-108 may exhibit substantially the same characteristics, such as substantially the same responsivity (the ratio between the photocurrent and the received optical power) and/or substantially the same dark current (the current generated when no optical power is received). In these embodiments, the photocurrents generated by photodetectors 102 and 106 responsive to reception of signal t may be substantially equal to each other. Such photocurrents are identified as "$i_t$" in FIG. 1. It should be noted that, due to the orientations of photodetectors 102 and 106, the photocurrents generated by photodetectors 102 and 106 are oriented in opposite directions. That is, the photocurrent of photodetector 102 is directed towards node 103 and the photocurrent of photodetector 106 is oriented away from node 105. Furthermore, the photocurrents generated by photodetectors 104 and 108 responsive to reception of signal b may be substantially equal to each other. Such photocurrents are identified as "$i_b$." Due to the orientations of photodetectors 104 and 108 relative to each other, the photocurrents generated by photodetectors 104 and 108 are oriented in opposite directions. That is, the photocurrent of photodetector 108 is directed towards node 105 and the photocurrent of photodetector 104 is oriented away from node 103.

In view of the orientations of the photodetectors, a current with amplitude $i_t - i_b$ emerges from node 103 and a current with amplitude $i_b - i_t$ emerges from node 105. Thus, the currents have substantially the same amplitudes, but with opposite signs.

Photodetectors 102-108 may produce dark currents. Dark currents are typically due to leakage and arise from a photodetector regardless of whether the photodetector is exposed to light or not. Because dark currents arise even in the absence of incoming optical signals, dark currents effectively contribute to noise in the optical receiver. The inventors have appreciated that the negative effects of these dark currents can be significantly attenuated thanks to the current subtraction described above. Thus, in the example of FIG. 1, the dark current of photodetector 102 and the dark current of photodiode 104 substantially cancel out one another (or at least are mutually substantially reduced), and so do the dark currents of photodetector 106 and 108. Consequently, noise due to the presence of the dark currents is greatly attenuated.

Figure 2:
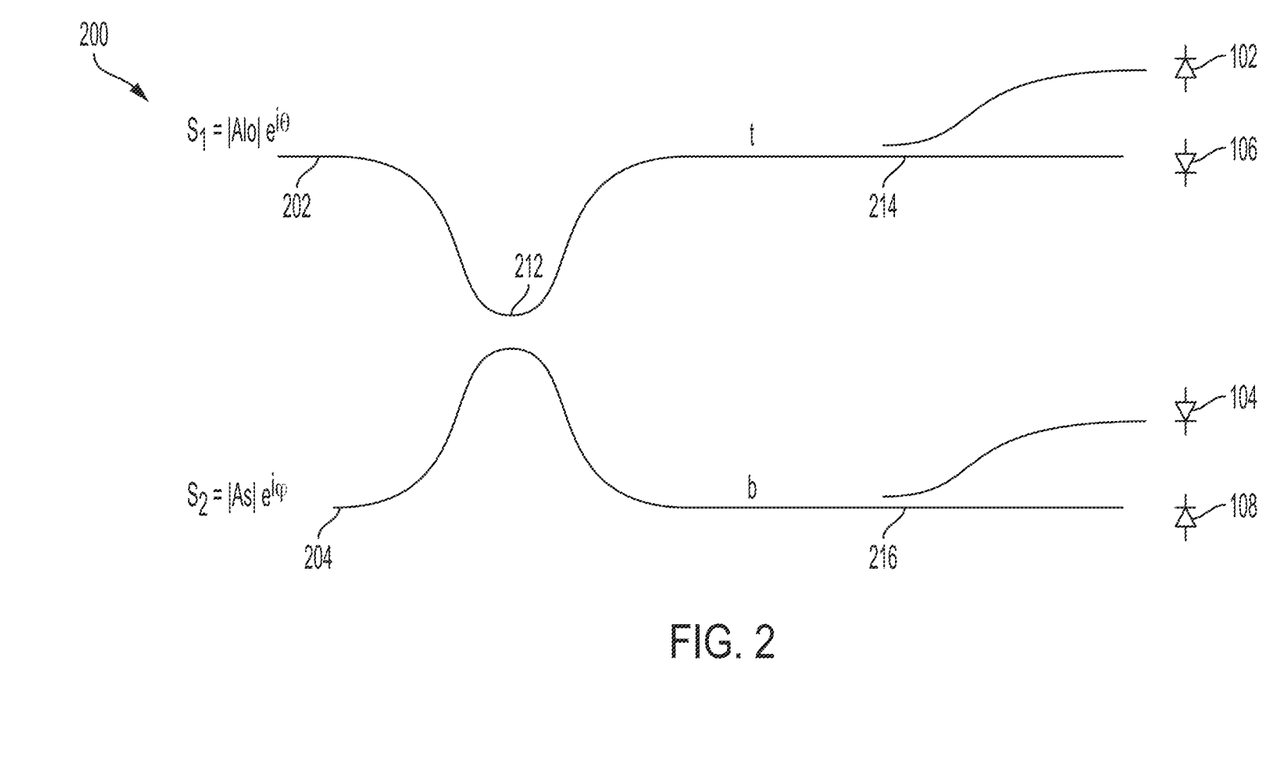
FIG. 2 is a schematic diagram illustrating a photonic circuit that may be coupled with the differential optical receiver of FIG. 1, in accordance with some non-limiting embodiments.

FIG. 2 illustrates a photonic circuit 200 arranged for providing two optical signals to photodetectors 102-108, in accordance with some non-limiting embodiments. Photonic circuit 200 may comprises optical waveguides for routing the optical signals to the photodetectors. The optical waveguides may be made of a material that is transparent or at least partially transparent to light at the wavelength of interest. For example, the optical waveguides be made of silicon, silicon oxide, silicon nitride, indium phosphide, gallium arsenide, or any other suitable material. In the example of FIG. 2, photonic circuit 200 includes input optical waveguides 202 and 204 and couplers 212, 214 and 216. As further illustrated, the output optical waveguides of photonic circuit 200 are coupled to photodetectors 102-108.

In the example of FIG. 2, couplers 212, 214 and 216 comprise directional couplers, where evanescent coupling enables transfer of optical power between adjacent waveguides. However, other types of couplers may be used such as Y-junctions, X-junctions, optical crossovers, counter-direction couplers, etc. In other embodiments, photonic circuit 200 may be implemented with a multi-mode interferometer (MMI). Couplers 212, 214 and 216 may be 3 dB couplers (with a 50%-50% coupling ratio) in some embodiments, though other ratios are also possible, such as 51%-49%, 55%-45% or 60%-40%. It should be appreciated that, due to fabrication tolerances, the actual coupling ratio may deviate slightly from the intended coupling ratio.

Signal $s_1$ may be provided at input optical waveguide 202 and signal $s_2$ may be provided at input optical waveguide 204. Signals $s_1$ and $s_2$ may be provided to the respective input optical waveguides using for example optical fibers. In some embodiments, $s_1$ represents a reference local oscillator signal, such as the signal generated by a reference laser, and $s_2$ represents the signal to be detected. As such, the optical receiver may be viewed as a homodyne optical receiver. In some such embodiments, $s_1$ may be a continuous wave (CW) optical signal while $s_2$ may be modulated. In other embodiments, both signals are modulated or both signals are CW optical signals, as the application is not limited to any particular type of signal.

In the example of FIG. 2, signal $s_1$ has amplitude $A_{LO}$ and phase $\vartheta$, and signal $s_2$ has amplitude $A_s$ and phase $\varphi$. Coupler 212 combines signals $s_1$ and $s_2$ such that signals t and b emerge at respective outputs of coupler 212. In the embodiments in which coupler 212 is a 3 dB coupler, t and b may be given by the following expression:

$$\binom{t}{b} = \frac{1}{\sqrt{2}}(1\ i\ i\ 1)\binom{A_{LO}e^{i\vartheta}}{A_s e^{i\varphi}}$$

and the powers T and B (of t and b, respectively) may be given by the following expressions:

$$T = [A_{LO}^2 + A_S^2 + 2A_{LO}A_S \sin(\vartheta - \varphi)]$$

$$B = [A_{LO}^2 + A_S^2 - 2A_{LO}A_S \sin(\vartheta - \varphi)]$$

Thus, in the embodiments in which couplers 214 and 216 are 3 dB couplers, photodetectors 102 and 106 may each receive a power given by T/2 and photodetectors 104 and 108 may each receive a power given by B/2.

Referring back to FIG. 1, and assuming that the responsivities of photodetectors 102-108 are all equal to each other (though not all embodiments are limited in this respect), the currents emerging from node 103 and 105, respectively, may be given by the following expressions:

$$i_t - i_b = 2A_{LO}A_S \sin(\vartheta - \varphi)$$

$$i_b - i_t = -2A_{LO}A_S \sin(\vartheta - \varphi)$$

DOA 110 is arranged to amplify the differential signal received at the "+" and "−" inputs, and to produce an amplified differential output, represented in FIG. 1 by voltages $V_{out,n}$ and $V_{out,p}$. In some embodiments, DOA 110, in combination with impedances z, may be viewed as a differential transimpedance amplifier, in that it produces a differential pair of voltage ($V_{out,n}$, $V_{out,p}$) based on a differential pair of current ($i_b - i_t$, $i_t - i_b$). In some embodiments, each of $V_{out,n}$, $V_{out,p}$ may be proportional to the difference between current $i_t - i_b$ and current $i_b - i_t$, thus giving rise to the following expressions:

$$V_{out,p} = 2z(i_t - i_b)$$

$$V_{out,n} = 2z(i_b - i_t)$$

This differential pair of voltages may be provided as input to any suitable electronic circuit, including but not limited to an analog-to-digital converter (not shown in FIG. 1). It should be noted that optical receiver 100 provides two levels of noise rejection. The first level of noise rejection occurs thanks to the subtraction of the photocurrents, the second level of noise rejection occurs thanks to the subtraction taking place in the differential amplification stage. This results in a significant increase in noise rejection.

In the example of FIG. 1, impedances z are shown as being equal to each other, however different impedances may be used in other embodiments. These impedances may include passive electric components, such as resistors, capacitors and inductors, and/or active electronic components, such as diode and transistors. The components constituting these impedances may be chosen to provide a desired gain and bandwidth, among other possible characteristics.

Figure 3A:
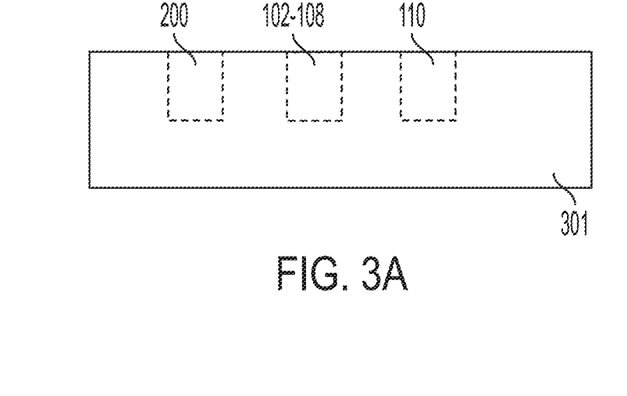
FIG. 3A is a schematic diagram illustrating a substrate including a photonic circuit, photodetectors and a differential operational amplifier, in accordance with some non-limiting embodiments.
Figure 3B:
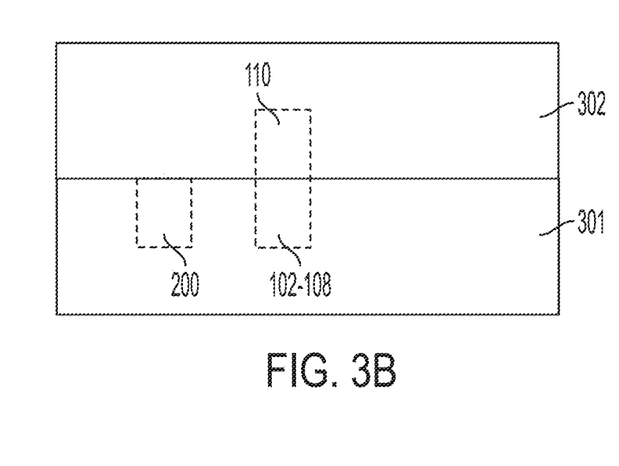
FIG. 3B is a schematic diagram illustrating a first substrate including a photonic circuit and photodetectors, and a second substrate including a differential operational amplifier, where the first and second substrates are flip-chip bonded to each other, in accordance with some non-limiting embodiments.
Figure 3C:
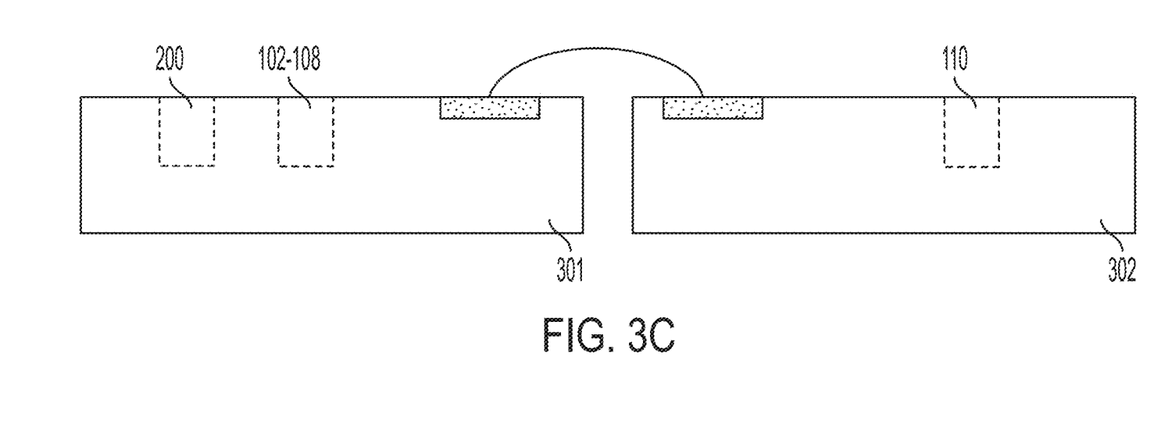
FIG. 3C is a schematic diagram illustrating a first substrate including a photonic circuit and photodetectors, and a second substrate including a differential operational amplifier, where the first and second substrates are wire bonded to each other, in accordance with some non-limiting embodiments.

As discussed above, optical receiver 100 may be integrated monolithically on a substrate. One such substrate is illustrated in FIG. 3A, in accordance with some non-limiting embodiments. In this example, photodetectors 102-108, photonic circuit 200 and DOA 110 are monolithically integrated as part of substrate 301. In other embodiments, photodetectors 102-108 and photonic circuit 200 may be integrated on substrate 301 and DOA 110 may be integrated on a separate substrate 302. In the example of FIG. 3B, substrates 301 and 302 are flip-chip bonded to one another. In the example of FIG. 3C, substrates 301 and 302 are wire bonded to one another. In yet another example (not illustrated), photodetectors 102-108 and photonic circuit 200 may be fabricated on separate substrates.

Figure 4A:
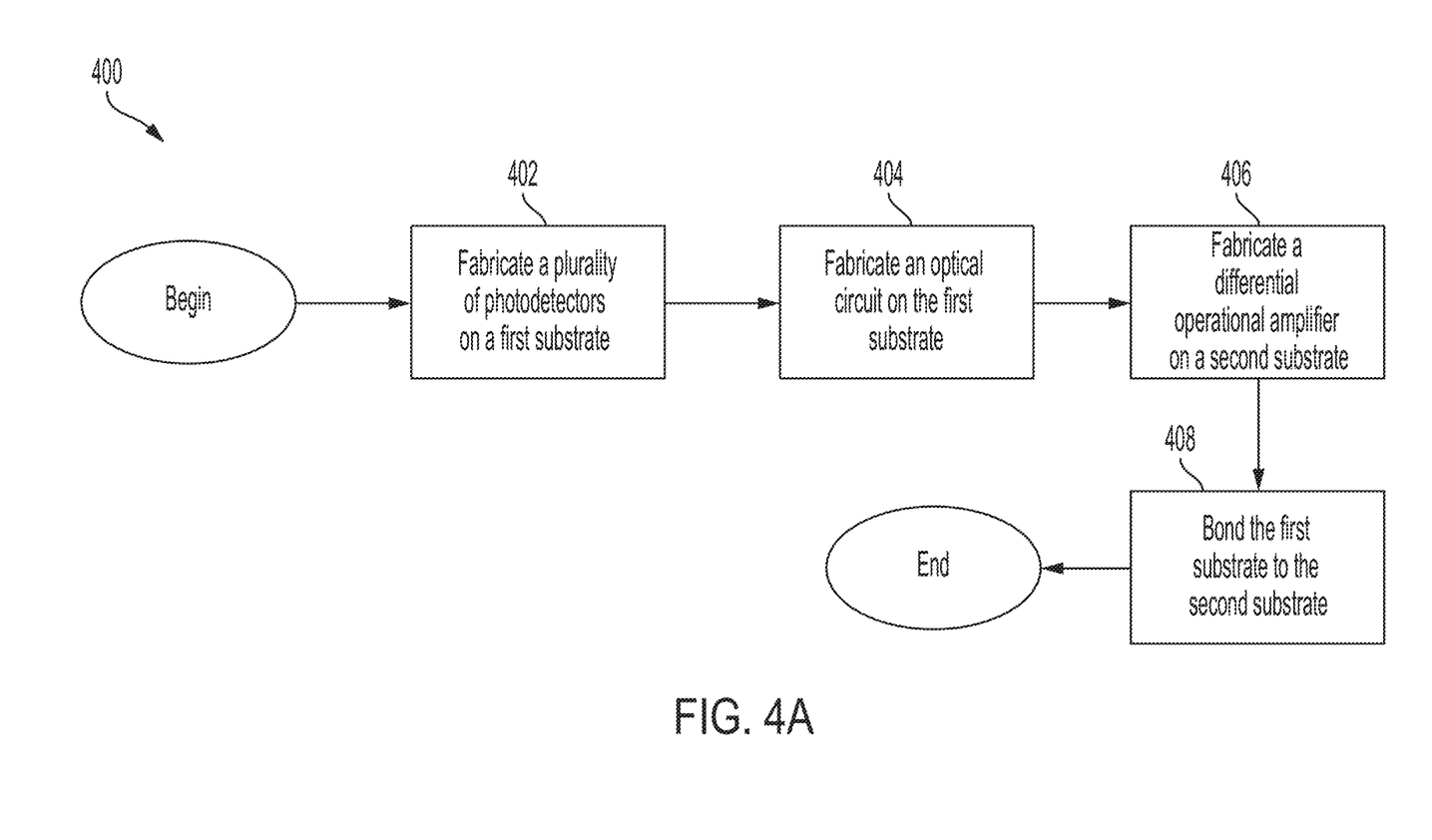
FIG. 4A is a flowchart illustrating an example of a method for fabricating an optical receiver, in accordance with some non-limiting embodiments.

Some embodiments of the present application are directed to methods for fabricating optical receivers. One such method is depicted in FIG. 4A, in accordance with some non-limiting embodiments. Method 400 begins at act 402, in which a plurality of photodetectors are fabricated on a first substrate. Once fabricated, the photodetectors may be connected together, for example in the arrangement shown in FIG. 1. In some embodiments, the photodetectors may be positioned on the first substrate within an area of 1 mm$^2$ or less, 0.1 mm$^2$ less or 0.01 mm$^2$ or less. At act 404, a photonic circuit is fabricated on the first substrate. The photonic circuit may be arranged to provide a pair of optical signals to the photodetectors, for example in the manner shown in FIG. 2. At act 406, a differential operational amplifier may be fabricated on a second substrate. An example of a differential operational amplifier is DOA 110 of FIG. 1. At act 408, the first substrate may be bonded to the second substrate, for example via flip-chip bonding (as shown in FIG. 3A), wire bonding (as shown in FIG. 3B), or using any other suitable bonding technique. Once the substrates are bonded, the photodetectors of the first substrate may be electrically connected to the differential operational amplifier of the second substrate, for example in the manner shown in FIG. 1.

Figure 4B:
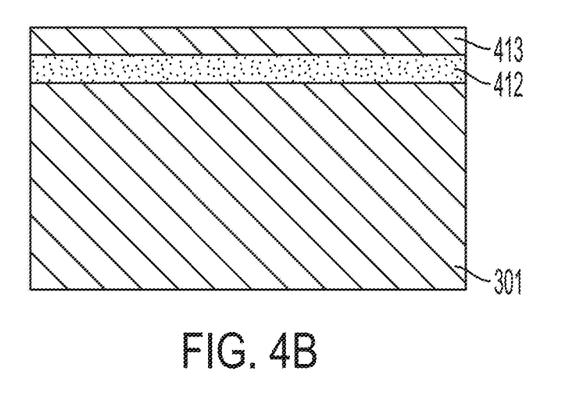
FIGS. 4B-4G illustrate an example of a fabrication sequence for an optical receiver, in accordance with some non-limiting embodiments.
Figure 4C:
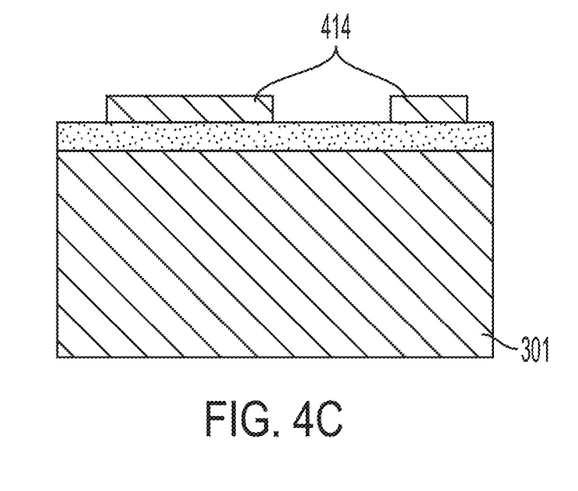

Examples of fabrication processes are depicted schematically at FIGS. 4B through 4G, in accordance with some embodiments. FIG. 4B depicts a substrate 301 having a lower cladding 412 (e.g., an oxide layer such as a buried oxide layer or other types of dielectric materials) and a semiconductor layer 413 (e.g., a silicon layer or a silicon nitride layer, or other types of material layers). At FIG. 4C, semiconductor layer 413 is patterned, for example using a photolithographic exposure, to form regions 414. Regions 414 may be arranged to form optical waveguides in some embodiments. In some embodiments, the resulting pattern resembles photonic circuit 200 (FIG. 2), where waveguides 202 and 204, and couplers 212, 214 and 216 are embedded into one or more regions 414. At FIG. 4D, photodetectors 102, 104, 106 and 108 (and optionally, other photodetectors) are formed. In this example, an optical absorbing material 416 is deposited to be adjacent a region 414. The optical absorbing material 416 may be patterned to form the photodetectors. The material used for the optical absorbing material may depend on the wavelength to be detected. For example, germanium may be used for wavelengths in the L-Band, C-Band or O-Band. Silicon may be used for visible wavelengths. Of course, other materials are also possible.

Figure 4D:
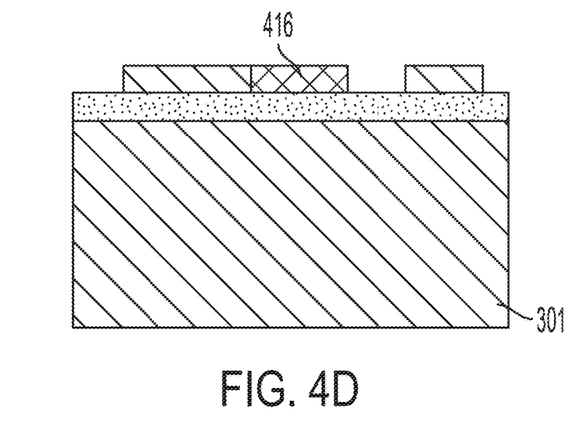

The optical absorbing material 416 may be positioned to be optically coupled to regions 414 in any suitable way, including but not limited to butt coupling, taper coupling and evanescent coupling.

Figure 4E:
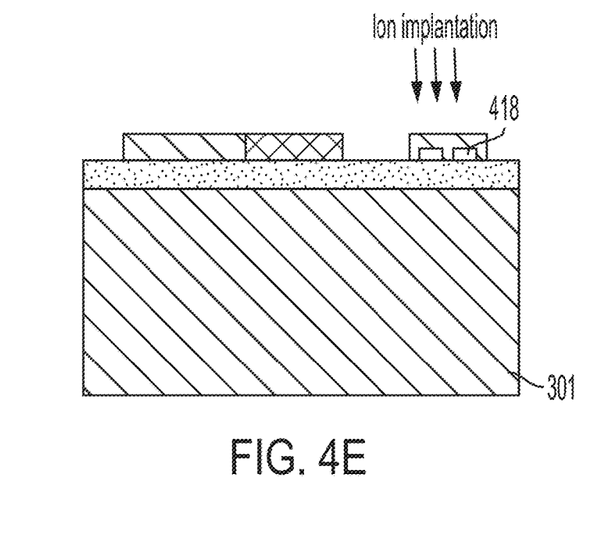

At FIG. 4E, DOA 110 is formed. In some embodiments, DOA 110 includes several transistors formed via ion implantation. FIG. 4E depicts implanted regions 418, which may form part of one or more transistors of DOA 110. While only one ion implantation is illustrated in FIG. 4E, in some embodiments, formation of DOA 110 may involve more than one ion implantations. Additionally, DOA 110 may be electrically connected to the photodetectors, for example via one or more conductive traces formed on substrate 301.

Figure 4F:
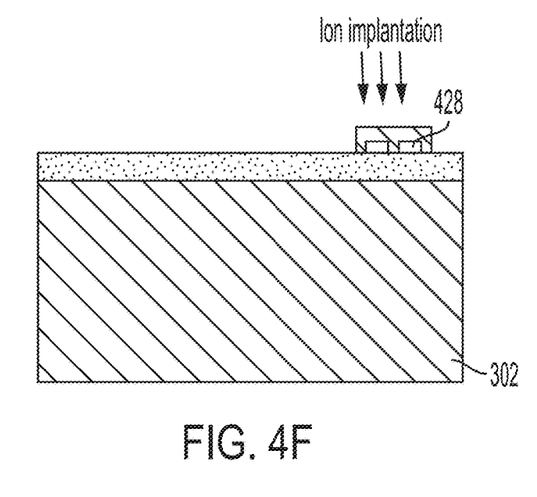

The arrangement of FIG. 4E is such that photonic circuit 200, photodetectors 102-108 and DOA 110 are formed on a common substrate (as shown in FIG. 3A). Arrangements in which DOA 110 is formed on a separate substrate (as shown in FIG. 3B or FIG. 3C) are also possible. In one such example, DOA 110 is formed on a separate substrate 302, as shown in FIG. 4F, where implanted regions 428 are formed via one or more ion implantations.

Figure 4G:
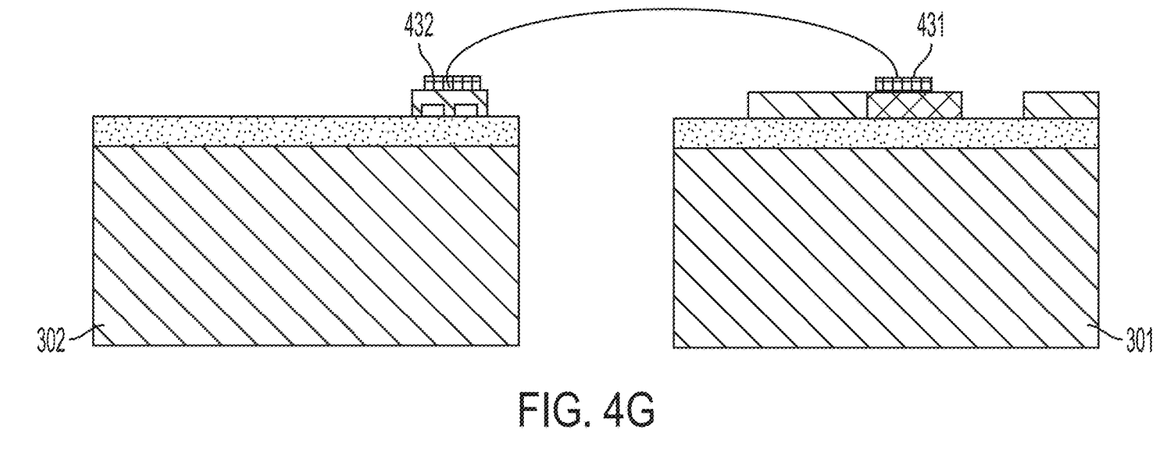

Subsequently, substrate 301 is bonded to substrate 302, and photodetectors 102-108 are connected to DOA 110. At FIG. 4G, conductive pads 431 are formed and placed in electrical communication with optical absorbing material 416, and conductive pads 432 are formed and placed in electrical communication with implanted regions 428. The conductive pads are electrically connected via wire bonding (as shown in FIG. 4G) or via flip-chip bonding.

Some embodiments are directed to methods for receiving input optical signals. Some such embodiments may involve homodyne detection, though the application is not limited in this respect. Other embodiments may involve heterodyne detection. Yet other embodiments may involve direct detection. In some embodiments, reception of optical signals may involve optical receiver 100 (FIG. 1), though other types of receivers may be used.

Figure 5:
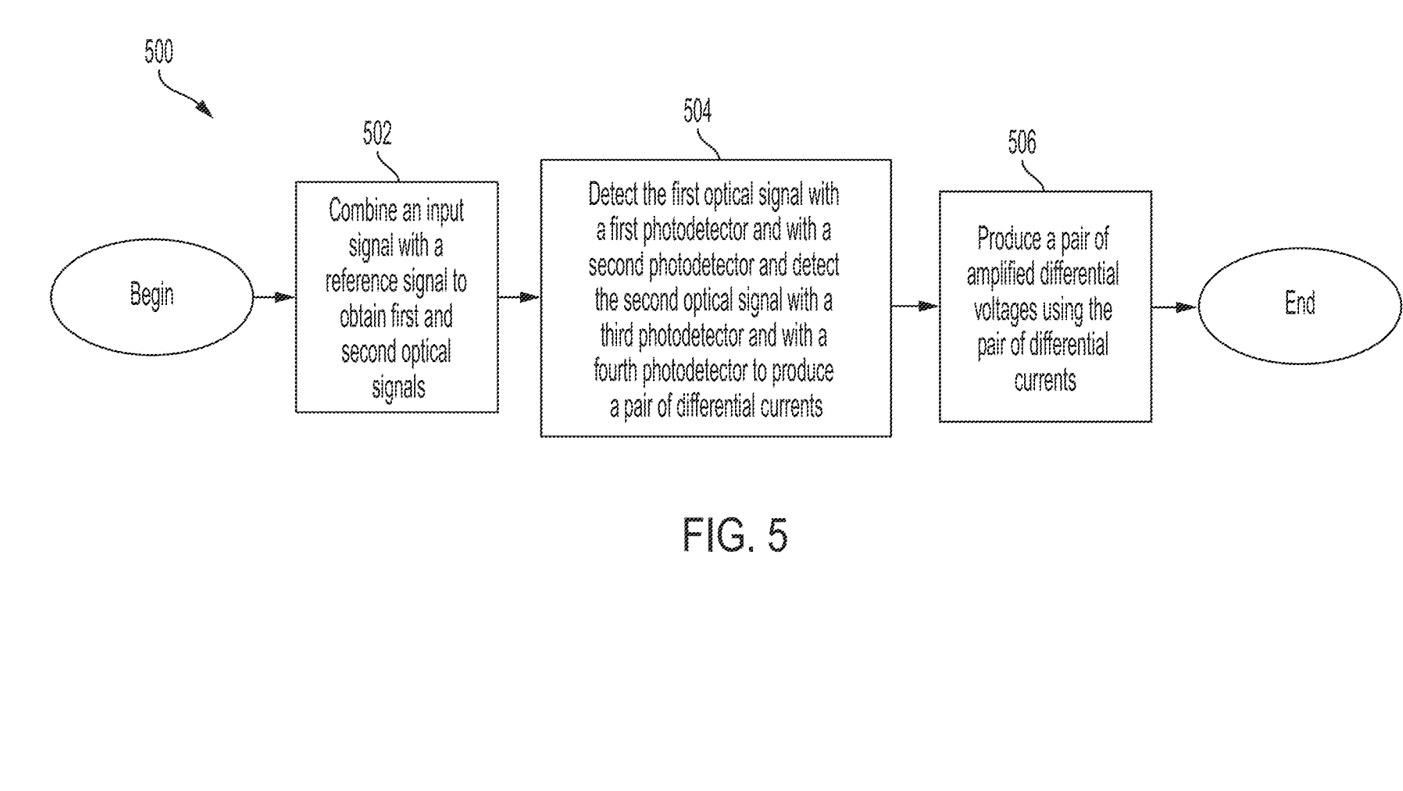
FIG. 5 is a flowchart illustrating an example of a method for receiving an optical signal, in accordance with some non-limiting embodiments.

An example of a method for receiving an input optical signal is depicted in FIG. 5, in accordance with some embodiments. Method 500 begins at act 502, in which the input signal is combined with a reference signal to obtain first and second optical signals. The input signal may be encoded with data, for example in the form of amplitude modulation, pulse width modulation, phase or frequency modulation, among other types of modulation. In some of the embodiments involving homodyne detection, the reference signal may be a signal generated by a local oscillator (e.g., a laser). In other embodiments, the reference signal may also be encoded with data. In some embodiments, the input signal and the reference signal are combined using a photonic circuit 200 (FIG. 2), though other types of optical combiners may be used, including but not limited to MMIs, Y-junctions, X-junctions, optical crossovers, and counter-direction couplers. In the embodiments in which photonic circuit 200 is used, t and b may represent the signals obtained from the combination of the input signal with the reference signal.

At act 504, the first optical signal is detected with a first photodetector and with a second photodetector and the second optical signal is detected with a third photodetector and with a fourth photodetector to produce a pair of differential currents. In some embodiments, act 504 may be performed using optical receiver 100 (FIG. 1). In some such embodiments, the first optical signal is detected with photodetectors 102 and 106, and the second optical signal is detected with photodetectors 104 and 108. The produced pair of differential currents is represented, collectively, by currents $i_b-i_t$ and $i_t-i_b$. Being differential, in some embodiments, the currents of the pair may have substantially equal amplitudes, but with substantially opposite phases (e.g., with a π-phase difference).

At act 506, a differential operational amplifier (e.g., DOA 110 of FIG. 1) produces a pair of amplified differential voltages using the pair of differential currents produced at act 504. In the embodiments that use DOA 110, the produced pair of differential voltages is represented by voltages $V_{out,n}$ and $V_{out,p}$. Being differential, in some embodiments, the voltages of the pair may have substantially equal amplitudes, but with substantially opposite phases (e.g., with a π-phase difference).

Method 500 may have one or more advantages over conventional methods for receiving optical signals, including for example wider dynamic range, greater signal-to-noise ratio, larger output swing, and increased supply-noise immunity.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. An optical receiver comprising:
   a differential amplifier having first and second inputs and first and second outputs;
   a first photodetector configured to produce a first photocurrent and a second photodetector configured to produce a second photocurrent, the first and second photodetectors being coupled to the first input of the differential amplifier, wherein an anode of the first photodetector is coupled to a cathode of the second photodetector thereby producing a first differential current based on a difference between the first photocurrent and the second photocurrent;
   a third photodetector configured to produce a third photocurrent and a fourth photodetector configured to produce a fourth photocurrent, the third and fourth photodetectors being coupled to the second input of the differential amplifier, wherein a cathode of the third photodetector is coupled to an anode of the fourth photodetector thereby producing a second differential current based on a difference between the fourth photocurrent and the third photocurrent; and
   a photonic circuit configured to provide:
      a first optical signal to the first and third photodetectors, and
      a second optical signal to the second and fourth photodetectors.

2. The optical receiver of claim 1, wherein the anode of the first photodetector and the cathode of the second photodetector are coupled to the first input of the differential amplifier.

3. The optical receiver of claim 1, wherein the cathode of the third photodetector and the anode of the fourth photodetector are coupled to the second input of the differential amplifier.

4. The optical receiver of claim 1, wherein the first, second, third and fourth photodetectors are formed monolithically on a common substrate.

5. The optical receiver of claim 4, wherein the common substrate comprises a silicon substrate.

6. The optical receiver of claim 4, wherein the first, second, third and fourth photodetectors are disposed within an area of 0.1 mm² on the substrate.

7. The optical receiver of claim 1, wherein the first, second, third and fourth photodetectors have equal responsivities.

8. The optical receiver of claim 1, wherein the first, second, third and fourth photodetectors are photodiodes.

9. The optical receiver of claim 1, further comprising an analog-to-digital converter coupled to the first and second outputs of the differential amplifier.

10. The optical receiver of claim 1, wherein the photonic circuit is configured to generate the first and second optical signals by combining a modulated optical signal with a reference optical signal.

11. A method for receiving an input signal, the method comprising:
   combining the input signal with a reference signal to obtain first and second optical signals;
   producing first and second photocurrents by detecting the first optical signal with a first photodetector and with a second photodetector, respectively, and producing third and fourth photocurrents by detecting the second optical signal with a third photodetector and with a fourth photodetector, respectively; and producing a pair of amplified differential voltages using first and second differential currents, the first differential current obtained based on a difference between the first photocurrent and the second photocurrent, and the second differential current obtained based on a difference between the fourth photocurrent and the third photocurrent.

12. The method of claim 11, wherein combining the input signal with the reference signal comprises combining the input signal with the reference signal with a directional coupler.

13. The method of claim 11, wherein producing the pair of amplified differential voltages comprises producing the pair of amplified differential voltages using the first and second differential currents with a differential operational amplifier.

\* \* \* \* \*